Aug. 21, 1956 E. H. HUGENHOLTZ ET AL 2,760,072

AUTOMATIC FREQUENCY STABILISATION

Filed Sept. 25, 1952 2 Sheets-Sheet 1

INVENTORS
EDUARD HERMAN HUGENHOLTZ
MARIUS ROBERT MANTZ
BY Fred M Vogel
AGENT

INVENTORS
EDUARD HERMAN HUGENHOLTZ
MARIUS ROBERT MANTZ

BY

Fred M Vogel

AGENT 2,760,072

AUTOMATIC FREQUENCY STABILISATION

Eduard Herman Hugenholtz and Marius Robert Mantz, Hilversum, Netherlands, assignors to Hartford National Bank and Trust Company, Hartford, Conn., as trustee Application September 25, 1952, Serial No. 311,424

Claims priority, application Netherlands October 5, 1951

3 Claims. (Cl. 250—36)

Figure 1:
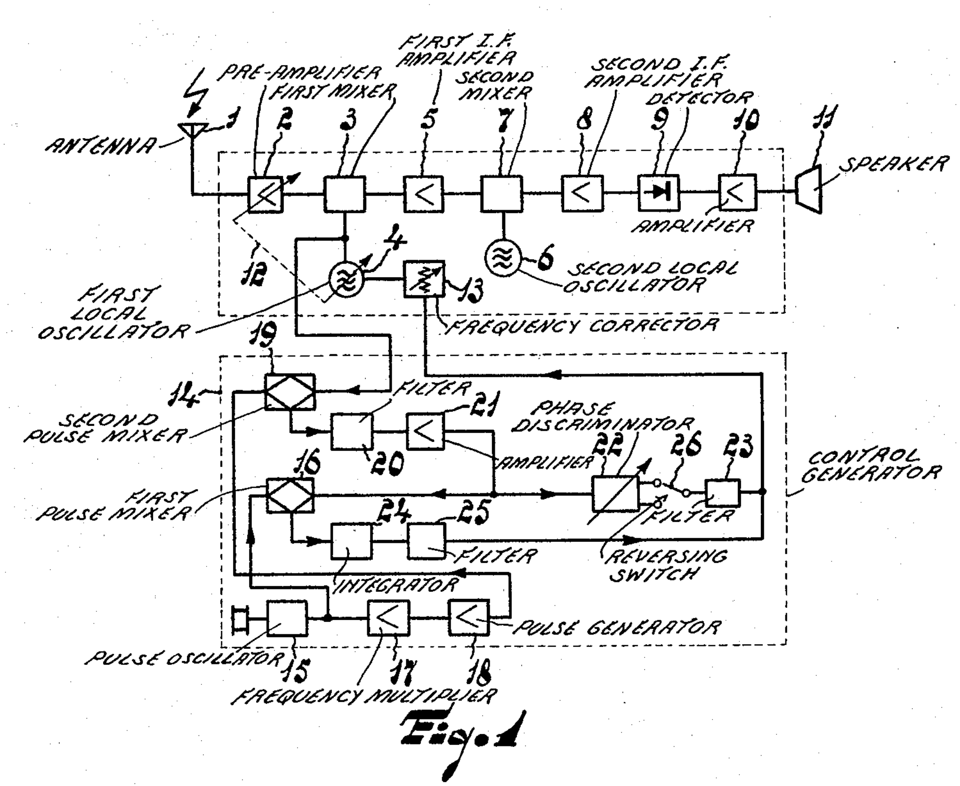

The invention relates to tunable oscillators of the kind associated with a frequency corrector for automatic stabilisation of the generated frequency with respect to stabilising oscillations. Such oscillators may be used with advantage in transmitters and receivers tunable to different communication frequencies.

The invention relates, more particularly, to tunable oscillators of the said kind in which the stabilisation is governed by a control-voltage derived from a control generator comprising a normally cut-off pulse-mixing stage in which the oscillator voltage is mixed with stabilising pulses periodically releasing the pulse-mixing stage, from which stage a beat frequency is supplied through a selective filter to a phase discriminator of the bandpass type producing a direct control-voltage for coarse frequency correction of the oscillator and to a mixing stage operating under the control of a further stabilising oscillation as a discriminator producing a direct control-voltage for fine adjustment of the oscillator.

In such arrangements the tunable oscillator is stabilised on a frequency (interpolation frequency) lying between harmonics of the stabilising pulses supplied to the aforesaid pulse mixing stage. In order to stabilise the oscillator on another interpolation frequency lying between the same harmonics of the stabilising pulses, it has hitherto been necessary for the tuning frequencies of the phase discriminator and the selective filter for the beat frequencies to be varied. At the same time the stabilising frequency supplied to the second mentioned mixing stage must be varied, unless this mixing stage is formed by a (second) normally cut-off pulse-mixing stage which is periodically released by stabilising pulses having a recurrence frequency which is a subharmonic of the recurrence frequency of the stabilising pulses supplied to the first pulse mixing stage, the harmonics of which correspond to the desired interpolation frequencies.

The invention provides a simple measure whereby stabilisation of the tunable oscillator on two different interpolation frequencies can be achieved without variation of the tuning of the control generator. According to the invention, for this purpose, the output circuit of the said phase discriminator is provided with a reversing switch to permit reversal of the polarity of the direct control-voltage taken from the said phase discriminator.

If, in order to permit the oscillator to be stabilised on a series of interpolation frequencies each lying between successive harmonics of the stabilising pulses supplied to the aforesaid (first) pulse mixing stage, the second mixing stage is formed by a second normally cut-off pulse-mixing stage, which is periodically released by stabilising pulses having a recurrence frequency which is a subharmonic of the recurrence frequency of the stabilising pulses supplied to the first mixing stage, the phase discriminator is preferably tunable in interpolating steps within a frequency range extending from a frequency component of the stabilising pulses supplied to the first mixing stage to midway towards an adjacent frequency component of these stabilising pulses; in this event the selective filter for the beat frequency need no longer be constructed so as to be tunable, but may be formed as a fixed-tuned bandpass filter having a band-width correponding to the said frequency range.

Figure 2:
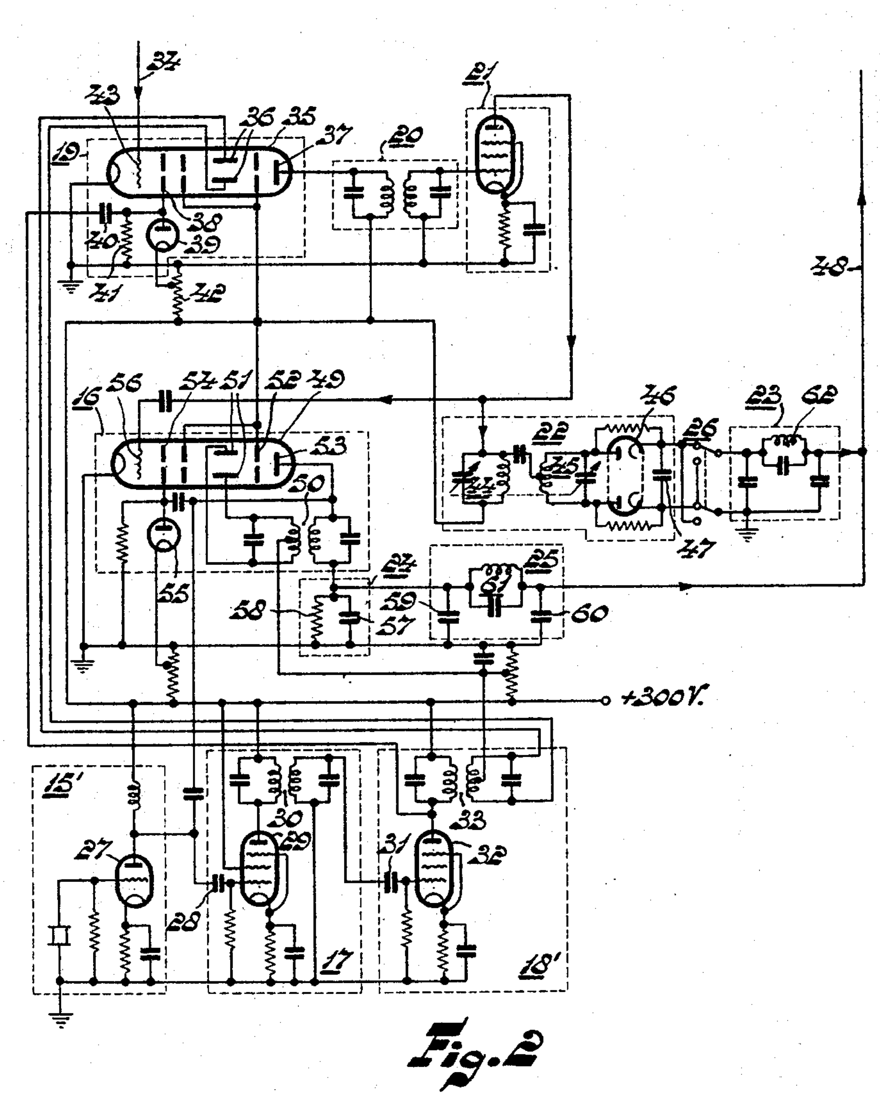

In order that the invention may be more clearly understood and readily carried into effect, it will now be described more fully with reference to the accompanying drawings, in which Fig. 1 shows a block diagram of a communication receiver according to the invention and Fig. 2 illustrates a preferred form of control-generator.

The communication receiver shown in Fig. 1 is of the double-superheterodyne type. The oscillations received by the receiving aerial 1 are supplied, through a tunable high-frequency pre-amplifier 2, to a first mixing stage 3 to which is also connected a tunable oscillator 4 forming the first local oscillator. The intermediate-frequency oscillations taken from the mixing stage 3 are supplied through a first intermediate-frequency amplifier 5 to a second mixing stage 7 to which is connected a crystal-controlled oscillator 6 forming the second local oscillator 6. The resulting beat oscillations are amplified in a second intermediate-frequency amplifier 8. A detector 9 is connected to the second intermediate-frequency amplifier 8 and furnishes demodulated oscillations, which are supplied through a low-frequency amplifier 10 to a loudspeaker 11.

The tuning elements of the tunable high-frequency pre-amplifier 2 and the first local oscillator 4 are preferably coupled mechanically in well-known manner as indicated diagrammatically in the figure by a broken line 12.

Let it be assumed for the sake of explanation that the receiver is required to be tunable over the range from 20 to 40 mc./s. in coarse steps to multiples of 1 mc./s. and in fine steps to multiples of 0.1 mc./s. Tuning to multiples of 0.5 mc./s. is for the sake of simplicity left out of consideration hereinafter, since with the numerical example taken this would give rise to complications which are not essential for proper understanding of the present invention and which, therefore, need not be explained.

The receiver is tuned to a desired communication channel by tuning the pre-amplifier 2 and the first local oscillator 4 with an accuracy of about 20 to 100 kc./s., for example, with the use of a manual tuning mechanism of the pawl-lock type after which automatic correction and stabilisation of the oscillator frequency is effected by means of a frequency corrector 13, for example, a reactance tube. The frequency corrector is governed by the control-voltage from a control generator 14.

The control generator 14 operates as follows.

A crystal-controlled oscillator 15 supplies short pulses (with a duty-cycle, for example, not exceeding 1/50) having a recurrence frequency of 0.1 mc./s., these pulses periodically releasing a first pulse-mixing stage 16 (normally cut off) and controlling a frequency multiplier 17 to produce a sine wave oscillation of 0.5 mc./s. This oscillation from the frequency multiplier 17 synchronizes a pulse generator 18 which furnishes short pulses (with a duty-cycle, for example, not exceeding 1/50), having a recurrence frequency of 1 mc./s., for the periodic release of a second pulse-mixing stage 19 which, like the first, is normally cut off. The pulse mixing stage 19 is also supplied with the output from the local oscillator 4 which has a frequency of, for example, 23.7 mc./s. and requires to be stabilized. The mixing of this frequency with, say, the 22 mc./s. harmonic of the 1 mc./s. pulses generates a beat frequency of about 1.7 mc./s., which is separated by a selective filter 20 from other beat frequencies produced in the mixing stage and which is supplied to an amplifier 21. For reasons to be explained more fully hereinafter, the filter 20 is preferably constructed in the form of a fixed-tuned bandpass filter having a pass range such that beat frequencies of about 1.6 mc./s., 1.7 mc./s., 1.8 mc./s. and 1.9 mc./s. are allowed to pass and that frequencies lying beyond the frequency range of about 1.6 to 1.9 mc./s. are suppressed.

The beat frequency of about 1.7 mc./s. taken from the amplifier 21 is supplied on the one hand to a phase discriminator 22 of the bandpass type and on the other hand to the pulse-mixing stage 16, operating as a phase discriminator of the detector type. These discriminators may be of known kind and provide for coarse adjustment and fine adjustment respectively of the frequency to be stabilised.

The frequency discriminator 22 is tunable in the range of 1.6 to 1.9 mc./s. in steps of 0.1 mc./s. and furnishes a direct control-voltage through a smoothing filter 23 to the frequency corrector 13 for the local oscillator 4, this voltage being positive or negative according as the beat frequency (and hence the frequency of the local oscillator 4 to be corrected) is higher or lower than the desired frequency, in the present case 1.7 mc./s. As is well known, a phase discriminator of the bandpass type furnishes a control-voltage only if there is a certain frequency deviation, so that it cannot reduce frequency deviations to zero. This reduction to zero is obtained by providing the phase discriminator 16 of the phase-detector type, to which stabilising pulses having a recurrence frequency of 0.1 mc./s. are supplied. This phase discriminator 16 becomes automatically operative as soon as the frequency difference between the beat frequency applied (in the present case about 1.7 mc./s.) and a harmonic of the control-pulses (in the present case the 1.7 mc./s. harmonic) becomes lower than the "catching" frequency range of the detector for example, 0.5 to 10 kc./s. Thereupon the output voltage of the pulse-mixing stage 16, which voltage is supplied to the corrector 13 through a network 24 integrating the amplitude-modulated output pulses and through a low pass filter 25, together with the output voltage of the smoothing filter 23, provides for locking of the frequencies which are thus compared by means of a D. C. control voltage varying with the phase relationship between the voltages compared in the phase detector 16 (in the present case the 1.7 mc./s. beat frequency and the 1.7 mc./s. harmonic of the 0.1 mc./s. pulses). The frequency of the tunable oscillator 4 is then locked accurately at the desired frequency of 23.7 mc./s., i. e. at the sum of the frequencies of the 22 mc./s. harmonic of the 1 mc./s. stabilising pulses occurring in the pulse-mixing stage 19 and of the 1.7 mc./s. harmonic of the 0.1 mc./s. stabilising pulses supplied to the pulse-mixing stage 16.

In order to permit the first local oscillator 4 to be stabilised on another interpolation frequency without variation of the tuning of the control generator, the output circuit of the discriminator 22 comprises a polarity reversing switch 26 to reverse the polarity of the control-voltage taken from the said discriminator 22. After this switch 26 has been switched over, the control-circuit comprising the discriminator 22 is stable only if, in contradistinction to what has been described above, the frequency of the local oscillator 4 is lower by 1.7 mc./s. than the stabilising spectrum component of the 1 mc./s. stabilising pulses supplied to the pulse mixing stage 19. Consequently, now the local oscillator 4 may be tuned to about 23.3 mc./s. which frequency, upon being mixed with the 25 mc./s. component of the 1 mc./s. pulses, supplies a frequency difference of about 1.7 mc./s., from which, by means of the discriminator 22, a direct control-voltage stabilising the local oscillator 4 on about 23.3 mc./s. is derived. As soon as the difference frequency of 1.7 mc./s. sufficiently approximates in frequency to the 1.7 mc./s. component of the 0.1 mc./s. stabilising pulses, locking of the frequency of the local oscillator 4 occurs accurately at 23.3 mc./s. as a result of the detector-discriminator 16 coming into action consequently, at the difference between the frequencies of the 25 mc./s. harmonics of the 1 mc./s. stabilising pulses occurring in the pulse-mixing stage 19 and the 1.7 mc./s. harmonic of the 0.1 mc./s. stabilising pulses supplied to the stage 16.

It should be noted here that when changing over from 23.7 to 23.3 mc./s. nothing need be modified in the control-circuit comprising the discriminator 16, since, in contra-distinction to the circuit comprising the discriminator 22, this circuit does not respond to the sense of the frequency-difference between the oscillator frequency to be stabilised and the stabilising harmonic of the 1 mc./s. pulses in the pulse-mixing stage 19.

Upon tuning the oscillator 4 to 23.7 mc./s there arise not only the desired difference frequency of 1.7 mc./s. caused by the 22 mc./s. harmonic but also further difference frequencies caused by further harmonics of the 1 mc./s. stabilising pulses in the pulse-mixing stage 19; these frequencies are, for example, 0.7, 2.7, 3.7 mc./s. . . . and so forth caused by the 23, 21 and 20 mc./s. harmonics and so on respectively and 0.3, 1.3, 2.3 mc./s. . . . and so on caused by the 24, 25, 26 . . . mc./s. harmonics and so on. Upon tuning the oscillator 4 to 23.3 mc./s., the same difference frequencies are produced in a similar manner.

Upon tuning the discriminator 22 to 1.6 mc./s. (or 1.8 or 1.9 mc./s.) the oscillator 4 may be locked, dependent upon the position of the pole-reversing switch 26, on 23.4 mc./s. (or 23.2 or 23.1 mc./s. respectively) or on 23.6 mc./s. (or 23.8 or 23.9 mc./s. respectively). The undesirable difference frequencies then produced in the pulse-mixing stage 19 are 0.6 mc./s. (or 0.8 or 0.9 mc./s. respectively), 2.6 mc./s. (or 2.8 or 2.9 mc./s. respectively), 3.6 mc./s. (or 3.8 or 3.9 mc./s. respectively) . . . and so on and 0.4 mc./s. (or 0.2 or 0.1 mc./s. respectively) 1.4 mc./s. (or 1.2 or 1.1 mc./s. respectively), 2.4 mc./s. (or 2.2 or 2.1 mc./s. respectively) . . . and so on.

All the aforesaid unwanted difference-frequencies should not be supplied to the pulse-mixing stage 16 and may be suppressed either by making the filter 21 together with the discriminator 22 tunable in steps of 0.1 mc./s. in the range of 1.6 to 1.9 mc./s. or, which is simpler, by constructing this filter in the form of a fixed-tuned bandpass filter having a bandpass of about 1.6 to 1.9 mc./s., for example, or even a bandpass of 1.5 to 2 mc./s.

Fig. 2 is a detail view of a preferred embodiment of the control generator 14 shown in Fig. 1. The elements thereof which are shown in Fig. 1 are designated by the same reference numerals in Fig. 2.

A crystal-controlled oscillator 15′ comprises a triode 27, from which a sine wave oscillation of 0.1 mc./s. is taken. The output of this oscillator is supplied through a grid capacitor 28 to frequency-multiplier 17 comprising a pentode 29, the anode circuit of which includes an output transformer 30, tuned to 0.5 mc./s. The sine wave oscillations obtained, having a frequency of 0.5 mc./s., are supplied through a grid capacitor 31 to a second frequency-multiplier 18′, comprising a pentode 32, the anode circuit of which includes an output transformer 33 tuned to 1 mc./s. The elements 15′, 17 and 18′ correspond to the elements 15, 17 and 18, shown in Fig. 1 except that the elements 15′ and 18′ furnish sine wave oscillations and not pulses.

The sine wave output from 18′ with a frequency of 1 mc./s. must be converted into stabilising pulses, having a recurrence frequency of 1 mc./s., before they are mixed with the voltage of the local oscillator 4 which is supplied through the lead 34 to the control generator. In the embodiment shown in Fig. 2 the conversion is effected in the pulse-mixing stage by using a tube 35 of the beam-deflection type. The electron beam produced therein is deflected by the sine wave output-voltage of the pentode 32, supplied in push-pull to the deflection plates 36; the beam periodically strikes a collecting electrode 37, which is arranged behind a slot in a mask electrode 38. With such an arrangement the electron beam would normally strike the collecting electrode 37 approximately at each zero passage of the 1 mc./s. deflection voltage, i. e. twice per period. The pulse recurrence frequency would then be 2 mc./s., which is not desirable in the present case. In order to obviate this the electron beam is suppressed for the greater part of each period of the deflection voltage with the aid of an intensity-control electrode 38 arranged between the deflection plates 36 and the cathode of the tube. This intensity-control electrode 38 receives a 1 mc./s. voltage from the primary winding of the output transformer 33, this having a phase shift of 90° with respect to the deflection voltage supplied to the deflection plates 36 from the secondary of the output transformer. The voltage is supplied to the intensity-control electrode 38 through a diode detector circuit, comprising a diode 39, a capacitor 40 and a parallel resistor 41. The cathode of the diode 39 is connected to a tapping of a potientiometer resistor 42 connected in parallel with the anode voltage source and thus the diode is biassed to, for example, +40 v. This diode circuit operates as a biassed peak detector so that the intensity-control electrode 38 is positive relative to the cathode of the tube 35 for part only of the positive half-waves of the voltage supplied to the diode circuit, with the result that the collecting electrode 37 is struck by the electron beam only once during each period of the deflection voltage, so that pulses having a recurrence frequency of 1 mc./s. occur at this electrode.

The voltage of the local oscillator 4 to be stabilised is supplied by lead 34 to an intensity-control grid 43 of the tube 35, so that the 1 mc./s. pulses occurring at the collecting electrode 37 are modulated in amplitude by this oscillator voltage. Consequently, the tube 35 serves not only as a pulse generator but also as the pulse mixing stage 19 (shown in Fig. 1) and with the use of a fixed-tuned bandpass filter 20, the desired difference frequency of, for example, 1.7 mc./s. may be taken from the collecting electrode 37. This difference frequency is supplied through a pentode amplifier 21 to a tunable phase discriminator 22 of the bandpass type and to a pulse mixing stage 16, which, similarly to pulse mixing stage 19, also operates as a pulse generator and is therefore provided with a similar beam-deflection tube 49.

The discriminator 22 is of a known type and comprises tuning circuits 44 and 45, which are coupled inductively and capacitatively and are tunable in steps of 0.1 mc./s. from 1.6 to 1.9 mc./s. A push-pull rectifying circuit, comprising a double diode 46 and an output capacitor 47 is connected to the secondary side of the filter. The control-voltage occurring across the output capacitor 47 varies in polarity with the sense of the frequency-difference between the central frequency of the discriminator and the difference frequency supplied thereto.

The output circuit of the discriminator 22 comprises a polarity reversing switch 26, with the aid of which the lower or upper electrode of the output capacitor 47 may be connected to earth at will, whilst the other electrode is connected, through a smoothing filter 23, comprising a series circuit 62 tuned to 1 mc./s., to the output lead 48. As described with reference to Fig. 1, the position of the polarity reversing switch 26 determines whether the local oscillator is stabilised on a frequency higher or lower than the stabilising harmonic of the stabilising pulses occurring in the pulse-mixing stage 19.

The pulse-mixing stage 16, comprising the tube 49, operates as a phase detector to produce a D. C. control-voltage, which varies with the phase relationship between the voltage of difference frequency supplied thereto and a harmonic of the stabilising pulses, having a recurrence frequency of 0.1 mc./s.

In order to produce these stabilising pulses, a sine wave oscillation of 0.1 mc./s. taken from the crystal oscillator 15′ is supplied in push-pull through a tuned transformer 50 to the deflection plates 51, so that the electron beam in the tube 49 is deflected in the rhythm of the deflection voltage and intermittently strikes a collecting electrode 53, located behind a mask electrode 52. A voltage occurring at the primary side of the tuned transformer 50 and having a phase shift of 90° relative to the deflection voltage is supplied through a diode peak detector comprising a diode 55 to an intensity-control electrode 54 of the tube. Similarly to what has been described with reference to the tube 35, pulses having a recurrence frequency of 0.1 mc./s. thus occur at the collecting electrode 53.

The difference frequency taken from the pentode amplifier is supplied, in order to obtain amplitude demodulation of the pulses occurring at the collecting electrode 53, to an intensity-control grid 56 of the tube 49. Whilst the collecting electrode 37 of the tube 35 has a D. C. anode voltage, the collecting electrode 53 of the tube 49 is connected to earth through the primary circuit of the tuned transformer 50 and through an integrating network 24, so that the collecting electrode 53 is positive only intermittently relative to the cathode of the tube 49, i. e., each time during the positive half-waves of the voltage across the primary of the transformer 50, consequently, each time a pulse occurs.

The amplitude-modulated pulses obtained are added up in the integrating network 24, comprising the parallel combination of an integrating capacitor 57 and a resistor 58, in order to produce a D. C. control-voltage; this voltage is supplied through a smoothing filter 25 to the output lead 48. The filter 25 comprises shunt capacitors 59 and 60 and a series circuit 61, the latter tuned to the recurrence frequency of the pulses occurring at the collecting electrode 53, i. e., to 0.1 mc./s.

As has been described with reference to the block diagram shown in Fig. 1, the discriminator 22 furnishes a D. C. control-voltage suitable for coarse frequency correction of the oscillator to be stabilised and the pulse mixing stage 16 supplies a control-voltage for accurately locking the voltage of the oscillator to be stabilised on the desired frequency. By changing over the polarity-reversing switch 26, and without varying the tuning of the control generator, the local oscillator may be stabilised on another interpolation frequency.

What we claim is:

1. A circuit-arrangement comprising a tunable oscillator provided with a frequency corrector for automatically stabilizing the oscillator frequency, and a control voltage generating device comprising a first normally cut-off pulse mixing stage for producing a beat frequency, means for applying stabilizing pulses to said stage to periodically release same, means for applying oscillations from said oscillator to said stage to mix therein with said stabilizing pulses, a selective filter, a bandpass type phase discriminator having an output circuit, means for applying the beat frequency from said mixing stage through said filter to said phase discriminator to produce in said discriminator output circuit a first direct control voltage, said output circuit including a reversing switch for reversing the polarity of the direct control voltage produced therein, means for applying the first direct control voltage from said output circuit to said frequency corrector to effect coarse frequency correction of said oscillator, a second mixing stage operating as a discriminator for producing a second direct control voltage, means for applying said beat frequency to said second mixing stage, means for applying stabilizing oscillations to said second stage to control the operation thereof whereby said second control voltage represents the difference between said beat frequency and said applied stabilizing oscillations, and means for applying the second control voltage from said second mixing stage to said frequency corrector to effect fine adjustment of said oscillator.

2. A circuit-arrangement, as set forth in claim 1, wherein said second mixing stage is a second normally cut-off pulse mixing stage, wherein said stabilizing oscillations are stabilizing pulses having a recurrence frequency which is a subharmonic of the recurrence frequency of the stabilizing pulses applied to said first pulse mixing stage and which periodically release said second pulse mixing stage, and wherein said phase discriminator is tunable in interpolation steps within a frequency range extending from a frequency component of the stabilizing pulses applied to said first mixing stage to midway towards an adjacent frequency component of these stabilizing pulses, whereby said oscillator is stabilized on one of a series of interpolation frequencies each lying between harmonics of the stabilizing pulses applied to said first pulse mixing stage.

3. A circuit-arrangement, as set forth in claim 2, wherein said selective filter comprises a fixed tuned band-pass filter having a bandwidth corresponding to said frequency range.

References Cited in the file of this patent

UNITED STATES PATENTS

| | | |
|---|---|---|
| 2,512,462 | Lyons | June 20, 1950 |
| 2,581,594 | MacSorley | Jan. 8, 1952 |
| 2,595,608 | Robinson | May 6, 1952 |